(12) United States Patent
Johnson et al.

(10) Patent No.: US 8,216,890 B2
(45) Date of Patent: Jul. 10, 2012

(54) LATERAL HYPERABRUPT JUNCTION VARACTOR DIODE IN AN SOI SUBSTRATE

(75) Inventors: Jeffrey B. Johnson, Essex Junction, VT (US); Alvin J. Joseph, Williston, VT (US); Robert M. Rassel, Colchester, VT (US); Yun Shi, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 409 days.

(21) Appl. No.: 12/550,658

(22) Filed: Aug. 31, 2009

(65) Prior Publication Data
US 2010/0230753 A1   Sep. 16, 2010

Related U.S. Application Data

(60) Provisional application No. 61/159,817, filed on Mar. 13, 2009.

(51) Int. Cl.
H01L 21/336 (2006.01)
(52) U.S. Cl. ............. 438/151; 257/E21.415; 257/347
(58) Field of Classification Search .............. 438/151; 257/E21.415
See application file for complete search history.

(56) References Cited

U.S. PATENT DOCUMENTS

| 6,429,054 B1 | 8/2002 | Krishnan et al. |
| 6,465,847 B1 * | 10/2002 | Krishnan et al. ............. 257/347 |
| 6,559,024 B1 | 5/2003 | Boles et al. |
| 6,878,983 B2 | 4/2005 | Coolbaugh et al. |
| 2006/0145300 A1 | 7/2006 | Coolbaugh et al. |

FOREIGN PATENT DOCUMENTS

JP  2000-299386  10/2000

* cited by examiner

Primary Examiner — Zandra Smith
Assistant Examiner — Paul Patton
(74) Attorney, Agent, or Firm — Scully, Scott, Murphy & Presser, P.C.; Anthony J. Canale

(57) ABSTRACT

A varactor diode includes a portion of a top semiconductor layer of a semiconductor-on-insulator (SOI) substrate and a gate electrode located thereupon. A first electrode having a doping of a first conductivity type laterally abuts a doped semiconductor region having the first conductivity type, which laterally abuts a second electrode having a doping of a second conductivity type, which is the opposite of the first conductivity type. A hyperabrupt junction is formed between the second doped semiconductor region and the second electrode. The gate electrode controls the depletion of the first and second doped semiconductor regions, thereby varying the capacitance of the varactor diode. A design structure for the varactor diode is also provided.

9 Claims, 10 Drawing Sheets

LATERAL HYPERABRUPT JUNCTION VARACTOR DIODE IN AN SOI SUBSTRATE

FIELD OF THE INVENTION

The present invention relates to semiconductor structures, and particularly to a lateral hyperabrupt junction varactor diode, and methods for manufacturing the same.

BACKGROUND OF THE INVENTION

A varactor diode is a diode having a variable capacitance, which may be modulated by an external control signal, which is typically in the form of a voltage signal applied to a control gate. The capacitance of the varactor diode may be varied by an external voltage bias that expands or shrinks a depletion region at a p-n junction.

The variability of the capacitance in a varactor may be advantageously employed in various electronic circuits to provide useful functions in amplifiers, oscillators, and frequency synthesizers. For example, varactors may be used to construct voltage-controlled oscillators (VCO), which generates a tunable stable frequency without employing a circuit with multiple oscillators. A VCO is a versatile basic building block for constructing transceiver circuitry, phase locked loop (PLL) circuitry, and other wireless communication circuitry.

The p-n junction of a varactor diode is reverse-biased to suppress current flow though the p-n junction. The capacitance of the varactor diode is varied with the control voltage as the volume of the depletion zone varies with the applied control voltage. Typically, the capacitance is inversely proportional to the thickness of the depletion region.

Metal-semiconductor-oxide (MOS) varactors employing a planar configuration are known in the art. One such example is a metal-oxide-semiconductor field effect transistor (MOSFET) varactor formed in a semiconductor substrate. While such a MOS varactor provides adequate performance in a bulk substrate, a MOSFET varactor formed in a top semiconductor layer in a semiconductor-on-insulator (SOI) substrate suffers from a higher leakage current than a bulk counterpart. As the thickness of the gate dielectric scales down, the increase in the leakage current compromises the effectiveness of a MOS varactor.

Further, formation of a varactor diode including a hyperabrupt junction in an SOI substrate is very difficult due to the limited thickness of the top semiconductor layer since formation of a hyperabrupt junction requires multiple ion implantation steps with different implantation depths. Since advanced semiconductor devices employ an SOI substrate having a thin top semiconductor layer, of which the thickness is typically less than 100 nm, and frequently less than 50 nm, the thickness of the top semiconductor layer is insufficient to form a hyperabrupt junction, or a sharp clearly-defined p-n junction including an abrupt transition in the doping profile with the distance from the junction surface. Thus, a high quality varactor diode is difficult to form on an SOI substrate including a thin top semiconductor layer employing conventional semiconductor structures.

In view of the above, there exists a need for a semiconductor structure providing a hyperabrupt junction within a thin top semiconductor layer of a semiconductor-on-insulator (SOI) substrate, and methods of manufacturing the same.

Particularly, there exists a need for a varactor diode including a hyperabrupt junction formed on an SOI substrate, and methods of manufacturing the same.

SUMMARY OF THE INVENTION

The present invention provides a semiconductor structure including a lateral hyperabrupt junction varactor diode in a top semiconductor layer of a semiconductor-on-insulator (SOI) substrate, and a method of forming the same.

A varactor diode includes a portion of a top semiconductor layer of a semiconductor-on-insulator (SOI) substrate and a gate electrode located thereupon. A first electrode having a doping of a first conductivity type laterally abuts a doped semiconductor region having the first conductivity type, which laterally abuts a second electrode having a doping of a second conductivity type, which is the opposite of the first conductivity type. A hyperabrupt junction is formed between the second doped semiconductor region and the second electrode. The gate electrode controls the depletion of the first and second doped semiconductor regions, thereby varying the capacitance of the varactor diode. A design structure for the varactor diode is also provided.

In the present invention, a gate conductor is formed over a region having a doping of a first conductivity type in a top semiconductor layer of a semiconductor-on-insulator (SOI) substrate. A region of the top semiconductor layer that is self-aligned to a gate spacer on the gate conductor is heavily doped with dopant of the first conductivity type to form a first electrode of a varactor diode. Another region of the top semiconductor layer on the opposite side of the first electrode is removed employing the gate spacer as a self-aligned mask to expose a substantially vertical sidewall in the top semiconductor layer. A lateral hyperabrupt junction is formed by angled ion implantations within a semiconductor portion below the gate conductor at a location laterally offset from the substantially vertical sidewall. An interface between a second electrode having a heavy doping of a second conductivity type, which is the opposite of the first conductivity type, and a first conductivity type doped semiconductor region constitute the lateral hyperabrupt junction. A design structure for the semiconductor structure is also provided.

According to an aspect of the present invention, a method of forming a semiconductor structure is provided, which comprises:

forming a gate stack on a doped semiconductor region having a doping of a first conductivity type in a top semiconductor layer of a semiconductor-on-insulator (SOI) substrate;

forming a first electrode having a doping of the first conductivity type on one side of the gate stack;

removing a portion of the doped semiconductor region on one side of the gate stack, wherein a substantially vertical sidewall of the doped semiconductor region is exposed; and forming a second electrode having a doping of the second conductivity type directly on the substantially vertical sidewall in another portion of the doped semiconductor region, wherein the second conductivity type is the opposite of the first conductivity type, and wherein a p-n junction is formed between the second electrode and a remaining portion of the doped semiconductor region.

In one embodiment, the method further comprises forming a gate spacer directly on the gate stack on the SOI substrate.

In another embodiment, the method further comprises forming a second-electrode-side metal semiconductor alloy portion directly on the substantially vertical sidewall and a buried insulator layer.

In even another embodiment, the p-n junction is substantially vertical and directly adjoins a top surface of a buried insulator layer and a top surface of the top semiconductor layer.

In yet another embodiment, the second electrode is formed by implanting dopants of the second conductivity type through the substantially vertical sidewall by angled ion implantation.

In still another embodiment, the first electrode, the second electrode, and the remaining portion of the doped semiconductor region are single crystalline and epitaxially aligned amongst one another.

In a further embodiment, the method further comprises forming a gate spacer directly on the gate stack, wherein the gate stack includes a gate dielectric vertically abutting the doped semiconductor region and a gate electrode, and wherein the p-n junction underlies the gate stack or the gate spacer.

In a yet further embodiment, the method further comprises:
forming a first-electrode-side metal semiconductor alloy portion directly on the first electrode;
forming a first-electrode-side contact via directly on the first-electrode-side metal semiconductor alloy portion;
forming a gate-side metal semiconductor alloy portion directly on said gate electrode;
forming a gate-side contact via directly on said gate-side metal semiconductor alloy portion; and
forming a middle-of-line (MOL) dielectric layer embedding the first-electrode-side contact via and the gate-side metal semiconductor alloy portion directly on a buried insulator layer.

In a still further embodiment, an entirety of the p-n junction is substantially vertical between a top surface of the top semiconductor layer and a bottom surface of the top semiconductor layer.

According to another aspect of the present invention, a semiconductor structure is provided, which comprises:
a first electrode comprising a semiconductor material, having a doping of a first conductivity type, and located in a top semiconductor layer of a semiconductor-on-insulator (SOI) substrate;
a doped semiconductor region comprising the semiconductor material, having a doping of the first conductivity type, and laterally abutting the first electrode;
a second electrode comprising a semiconductor material, having a doping of a second conductivity type, and laterally abutting the doped semiconductor region; and
a gate electrode overlying the doped semiconductor region.

In one embodiment, a p-n junction between the doped semiconductor region and the second electrode is substantially vertical and directly adjoins a top surface of a buried insulator layer and a top surface of the top semiconductor layer.

In another embodiment, the first electrode, the doped semiconductor region, and the second electrode are single crystalline and epitaxially aligned amongst one another.

In even another embodiment, the doped semiconductor region comprises:
a first doped semiconductor region having dopants of the first conductivity type and a first dopant concentration profile, wherein the first dopant concentration profile is substantially constant within the first doped semiconductor region; and
a second doped semiconductor region having dopants of the first conductivity type and a second dopant concentration profile, wherein the second dopant concentration profile monotonically decreases from a p-n junction with the second electrode to an interface with the first doped semiconductor region with a lateral distance from the p-n junction.

In yet another embodiment, the semiconductor structure further comprises a second-electrode-side metal semiconductor alloy portion laterally abutting a substantially vertical sidewall of the second electrode and vertically abutting a buried insulator layer.

In still another embodiment, the semiconductor structure further comprises a shallow trench isolation structure laterally abutting the first electrode and vertically abutting a buried insulator layer.

In still yet another embodiment, the semiconductor structure further comprises:
a gate dielectric vertically abutting the doped semiconductor region and the gate electrode; and
a gate spacer laterally abutting the gate electrode, wherein a substantially vertical p-n junction between the doped semiconductor region and the second electrode underlies the gate electrode or the gate spacer.

According to yet another aspect of the present invention, a design structure embodied in a machine readable medium for designing, manufacturing, or testing a design for a semiconductor structure is provided. The design structure comprises:
a first data representing a first electrode comprising a semiconductor material, having a doping of a first conductivity type, and located in a top semiconductor layer of a semiconductor-on-insulator (SOI) substrate;
a second data representing a doped semiconductor region comprising the semiconductor material, having a doping of the first conductivity type, and laterally abutting the first electrode;
a third data representing a second electrode comprising a semiconductor material, having a doping of a second conductivity type, and laterally abutting the doped semiconductor region; and
a fourth data representing a gate electrode overlying the doped semiconductor region.

In one embodiment, the second data comprises:
an additional data representing a first doped semiconductor region having dopants of the first conductivity type and a first dopant concentration profile, wherein the first dopant concentration profile is substantially constant within the first doped semiconductor region; and
another additional data representing a second doped semiconductor region having dopants of the first conductivity type and a second dopant concentration profile, wherein the second dopant concentration profile monotonically decreases from a p-n junction with the second electrode to an interface with the first doped semiconductor region with a lateral distance from the p-n junction.

In another embodiment, the design structure further comprises another data representing a second-electrode-side metal semiconductor alloy portion laterally abutting a substantially vertical sidewall of the second electrode and vertically abutting a buried insulator layer.

In yet another embodiment, the design structure further comprises:
a fifth data representing a first-electrode-side metal semiconductor alloy portion vertically abutting the first electrode;
a sixth data representing a first-electrode-side contact via vertically abutting the first-electrode-side metal semiconductor alloy portion;
a seventh data representing a gate-side contact via vertically abutting a gate-side metal semiconductor alloy portion located in the gate electrode; and
an eighth data representing a middle-of-line (MOL) dielectric layer embedding the first-electrode-side contact via and the gate-side metal semiconductor alloy portion and vertically abutting a buried insulator layer.

BRIEF DESCRIPTION OF THE DRAWINGS

FIG. 1 corresponds to a step after formation of a first doped semiconductor region 32 in a top semiconductor layer 30 of a semiconductor-on-insulator (SOI) substrate 8.

FIG. 2 corresponds to a step after formation of a stack of a gate dielectric layer 50L, a gate electrode layer 52L, and a dielectric gate cap layer 54L.

FIG. 3 corresponds to a step after formation of a gate stack (50, 52, 54) and a gate spacer 60.

FIG. 4 corresponds to a step after formation of a first electrode 34.

FIG. 5 corresponds to a step after removal of a portion of the doped semiconductor region 32 to expose a substantially vertical sidewall 31 of the first doped semiconductor region 32.

FIG. 6 corresponds to a step of formation of a second doped semiconductor region 36 and a second electrode 42.

FIG. 8 corresponds to a step after formation of various metal semiconductor alloy portions (73, 74, 75).

FIG. 9 corresponds to a step after formation of a middle-of-line (MOL) dielectric layer 80, various contact vias (83, 84, 85), a line-level dielectric layer 90, and various metal lines (93, 94, 95).

DETAILED DESCRIPTION OF THE INVENTION

Figure 1:
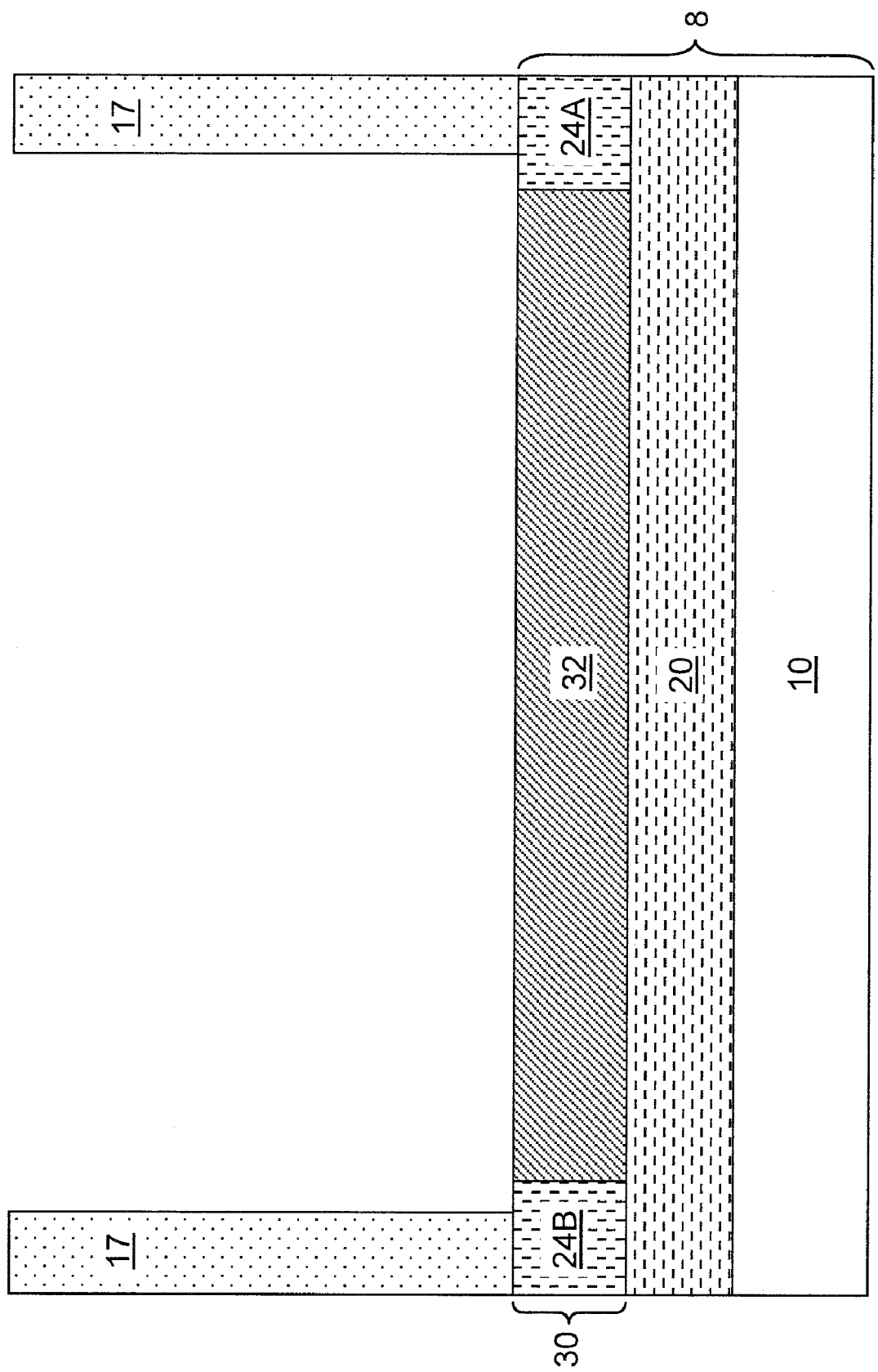
FIGS. 1-6, 8, and 9 are sequential vertical cross-sectional views of an exemplary semiconductor structure according to the present invention at various stages of a manufacturing sequence.

As stated above, the present invention relates to a lateral hyperabrupt junction varactor diode, and methods for manufacturing the same, which are described herein with accompanying figures. As used herein, when introducing elements of the present invention or the preferred embodiments thereof, the articles "a", "an", "the" and "said" are intended to mean that there are one or more of the elements. Throughout the drawings, the same reference numerals or letters are used to designate like or equivalent elements. Detailed descriptions of known functions and constructions unnecessarily obscuring the subject matter of the present invention have been omitted for clarity. The drawings are not necessarily drawn to scale.

As used herein, a structural element is referred to as being "on" another structural element when the structural element is located directly on the other structural element or when a set of at least one intervening element making direct physical contact with the structural element and the other structural element is present. A structural element is referred to as being "directly on" another structural element when there is no intervening structural element and a physical contact is formed between the structural element and the other structural element. Likewise, an element is referred to as being "connected" or "coupled" to another element when the element is directly connected or coupled to the other element or when a set of at least one intervening element provides connection or coupling with the element and the other element. An element is referred to as being "directly connected" or "directly coupled" to another element when there is no intervening element and the connection or coupling is provided between the element and the other element. An element "abuts" another element when a physical interface area providing a direct contact is present between the element and the other element.

Referring to FIG. 1, an exemplary semiconductor structure according to the present invention comprises a semiconductor substrate 8 including a bottom substrate layer 10, a buried insulator layer 20, and a top semiconductor layer 30. The bottom substrate layer 10 may comprise a semiconductor material, a metallic material, or a dielectric material. For example, the bottom substrate layer 10 may comprise silicon. The thickness of the bottom substrate layer is typically from about 50 microns to about 1,200 microns, and more typically from about 500 microns to about 1,000 microns. The bottom substrate layer 10 provides mechanical support for the buried insulator layer 20 and the top semiconductor layer 30. The buried insulator layer 20 comprises a dielectric material such as silicon oxide, silicon nitride, silicon oxynitride, sapphire, etc. Typically, the buried insulator layer 20 comprises silicon oxide. The thickness of the buried insulator layer 20 may be from about 50 nm to about 500 nm, although lesser and greater thicknesses are also contemplated herein.

Initially, the entirety of the top semiconductor layer 30 may comprise a contiguous single-crystalline semiconductor layer comprising a semiconductor material. Non-limiting examples of the semiconductor material for the contiguous single-crystalline semiconductor layer include silicon, a silicon germanium alloy portion, silicon, germanium, a silicon-germanium alloy portion, a silicon carbon alloy portion, a silicon-germanium-carbon alloy portion, gallium arsenide, indium arsenide, indium gallium arsenide, indium phosphide, lead sulfide, other III-V compound semiconductor materials, and II-VI compound semiconductor materials. A common semiconductor material for the top semiconductor layer 30 is silicon.

The thickness of the top semiconductor layer 30 may be from about 25 nm to about 500 nm, and typically from about 50 nm to about 150 nm, although lesser and greater thicknesses are also contemplated herein.

Shallow trench isolation structures comprising a dielectric material is formed within the top semiconductor layer 30. The shallow trench isolation structures forms at least one single-crystalline semiconductor portion, which is surrounded by the shallow trench isolation structures. The semiconductor device of the present invention is formed in one of the at least one single-crystalline semiconductor portion.

A single-crystalline semiconductor portion may be substantially intrinsic, may have a p-type doping, or may have an n-type doping. If the single-crystalline semiconductor portion has target doping level of a target doping type, which may be p-type or n-type, no additional ion implantation is necessary. In case the single-crystalline semiconductor portion does not have the target doping level of the target doping type, ion implantation may be employed to modify the doping concentration or the doping type of the single-crystalline semiconductor portion. The target doping type for the single-crystalline semiconductor portion is herein referred to as a first conductivity type, and the target doping concentration is herein referred to as first dopant concentration.

A single-crystalline semiconductor portion having the target doping concentration and the target dopant concentration is herein referred to as a first doped semiconductor region 32. To form the first doped semiconductor region 32, a first photoresist 17 may be applied over the top surface of the top semiconductor layer 30 and lithographically patterned to form an opening over a semiconductor portion of the top semiconductor layer 30. One edge of the first photoresist 17 is located over a first shallow trench isolation structure 24A, and another edge of the first photoresist 17 is located over a second shallow trench isolation structure 24B. The first and second shallow trench isolation structures (24A, 24B) may, or may not, be connected to each other.

Suitable dopants are implanted into the semiconductor portion within the opening in the first photoresist 17. For example, if the semiconductor portion is substantially intrinsic, has a doping of a second conductivity type, which is the opposite of the first conductivity type, has a doping of the first conductivity type but has a lower dopant concentration than the first concentration, dopants of the first conductivity type are implanted into the semiconductor portion, so that the implanted semiconductor portion becomes the first doped semiconductor region 32 having a doping of the first conductivity type at the first dopant concentration. The first conductivity type may be p-type or n-type. The first dopant concentration may be from about $1.0 \times 10^{16}/cm^3$ to about $3.0 \times 10^{18}/cm^3$, although lesser and greater first dopant concentrations are also contemplated herein. The dopant profile in the first doped semiconductor region 32 is a flat profile, which is substantially constant throughout the entirety of the first doped semiconductor region 32, and is herein referred to as a first dopant concentration profile.

Figure 2:
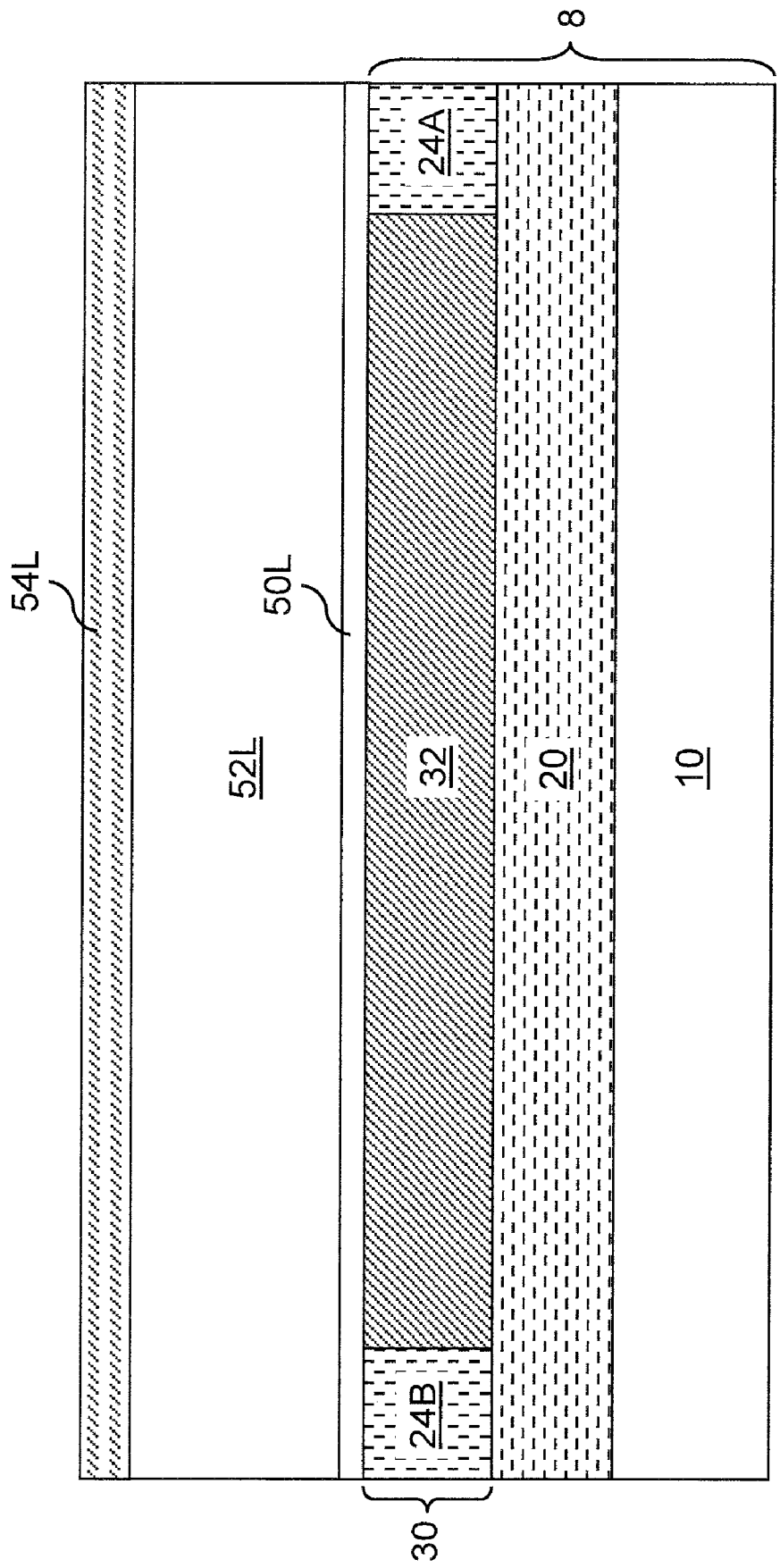

Referring to FIG. 2, a gate dielectric layer 50L is formed on a top surface of the top semiconductor layer 30, which include a top surface of the first doped semiconductor region 32, a top surface of the first shallow trench isolation structure 24A, and a top surface of the second shallow trench isolation structure 24B. In one case, the gate dielectric layer 50L comprises a dielectric material formed by conversion of a semiconductor material in an exposed portion of the active area into a dielectric material by thermal oxidation, thermal nitridation, plasma oxidation, plasma nitridation, or a combination thereof. For example, the first doped semiconductor region 32 may comprise silicon and the gate dielectric layer 50L may comprise a silicon oxide based dielectric material formed by thermal conversion of silicon into a dielectric material. The silicon based dielectric material may be thermal silicon oxide or a thermal silicon oxynitride. In case the gate dielectric layer 50L comprises a silicon oxide based material, the thickness of the gate dielectric layer 50L may be from about 0.8 nm to about 10 nm, and typically from about 1.0 nm to 6 nm, although lesser and greater thicknesses are also contemplated herein.

In another case, the gate dielectric layer 50L comprises a high dielectric constant (high-k) material. The high-k dielectric material comprises a dielectric metal oxide having a dielectric constant that is greater than the dielectric constant of silicon oxide of 3.9. Typically, the high-k dielectric material has a dielectric constant greater than 8.0. Non-limiting exemplary high-k dielectric materials include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from about 0.5 to about 3 and each value of y is independently from 0 to about 2. The high-k dielectric material layer may be formed by methods well known in the art including, for example, a chemical vapor deposition (CVD), an atomic layer deposition (PVD), molecular beam epitaxy (MBE), pulsed laser deposition (PLD), liquid source misted chemical deposition (LSMCD), etc. In case the gate dielectric layer 50L comprises a high-k dielectric material, the thickness of the gate dielectric layer 50L may be from about 2 nm to about 10 nm, although lesser and greater thicknesses are also contemplated herein also.

After formation of the gate dielectric layer 50L, a gate electrode layer 52L is formed on the gate dielectric layer 50L. In one case, the gate electrode layer 52L may be a semiconductor layer having a polycrystalline, microcrystalline, or amorphous structure. The semiconductor layer includes a semiconductor material such as silicon, a silicon containing alloy, a germanium containing alloy, a III-V compound semiconductor, or a II-IV semiconductor. The semiconductor layer may be doped with at least one electrical dopant such as boron, gallium, indium, phosphorus, arsenic, antimony, or a combination thereof. The semiconductor layer may be formed by chemical vapor deposition (CVD) such as rapid thermal chemical vapor deposition (RTCVD), low pressure chemical vapor deposition (LPCVD), plasma enhanced chemical vapor deposition (PECVD). The semiconductor layer may have a thickness from about 30 nm to about 300 nm, and preferably from about 50 nm to about 200 nm, and even more preferably from about 80 nm to about 150 nm.

In another case, the gate electrode layer 52L comprises a metal layer including a conductive metallic material, which may be a metal, a metal alloy, or a metal nitride. For example, the metal layer may comprise a material such as TaN, TiN, WN, TiAlN, TaCN, other conductive refractory metal nitrides, or an alloy thereof. The conductive metallic material is also known as metal gate material in the art. The thickness of the metal layer may be from about 5 nm to about 40 nm, and preferably from about 7 nm to about 20 nm, although lesser and greater thicknesses are also contemplated herein. The metal layer may be formed, for example, by chemical vapor deposition (CVD), physical vapor deposition (PVD), atomic layer deposition (ALD), etc.

In general, the gate electrode layer 52L may comprise a semiconductor layer, a metal layer, a plurality of semiconductor layers, a plurality of metal layers, a stack of a semiconductor layer and a metal layer, or a combination thereof.

A dielectric gate cap layer 54L is formed directly on the gate electrode layer 52L. The dielectric gate cap layer 54L comprises a dielectric material such as a dielectric oxide, a dielectric nitride, a dielectric oxynitride, or a combination thereof. For example, the dielectric gate cap layer 54L may comprise silicon oxide, silicon nitride, silicon oxynitride, or a combination thereof. The dielectric gate cap layer 54L may be formed by low pressure chemical vapor deposition (LPCVD), plasma enhanced chemical vapor deposition (PECVD), high density plasma chemical vapor deposition (HDPCVD), a spin-on coating, etc. The thickness of the gate cap layer 54L may be from about 5 nm to about 100 nm, and typically from about 12 nm to about 50 nm, although lesser and greater thicknesses are also contemplated herein.

Figure 5:
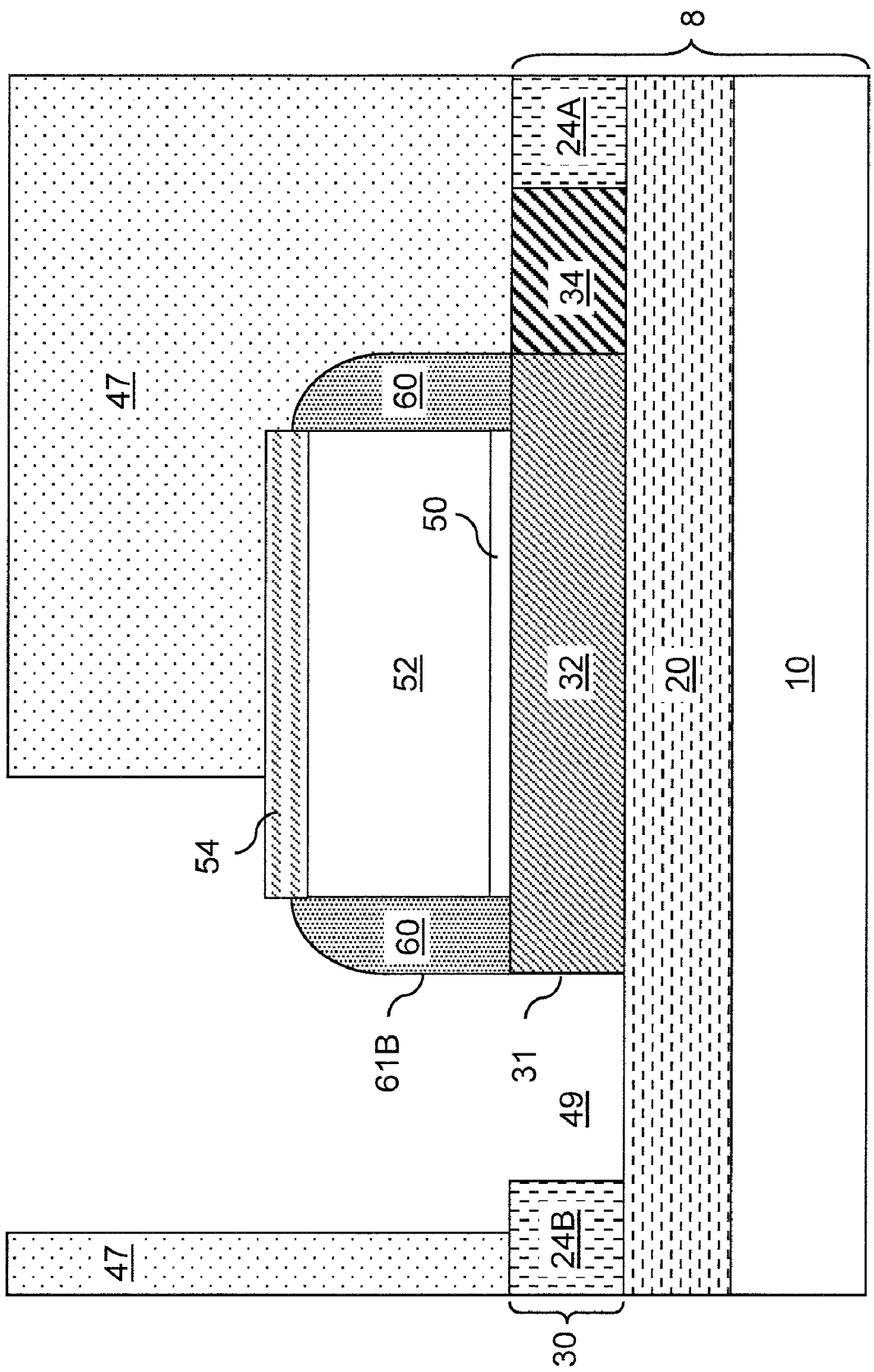

Referring to FIG. 5, a gate stack is formed by lithographic patterning of the dielectric gate cap layer 54L, the gate electrode layer 52L, and the gate dielectric layer 50L. The gate stack comprises a gate dielectric 50, which is a remaining portion of the gate dielectric layer 50L, a gate electrode 52, which is a remaining portion of the gate electrode layer 52L, and a dielectric gate cap 54, which is a remaining portion of the dielectric gate cap 54L. All sidewall surfaces of the gate stack are substantially vertically coincident, i.e., the sidewalls of the gate dielectric 50, the gate electrode 52, and the dielectric gate cap 54 vertically overlap. The gate dielectric 50 vertically abuts the top surface of the first doped semiconductor region 32.

A gate spacer 60 is formed directly on the sidewalls of the gate stack (50, 52, 54), for example, by conformal deposition of a dielectric material layer followed by an anisotropic ion etch, which removes horizontal portions of the dielectric material layer. A remaining vertical portion of the dielectric material layer laterally abuts and surrounds the gate stack (50, 52, 54), and constitutes the gate spacer 60. The outer sidewalls of the gate spacer 60, i.e., the sidewalls of the gate spacer 60 that do not laterally abut the gate stack (50, 52, 54), include substantially vertical portions that are directly adjoined to a top surface of the first doped semiconductor region 32. The bottom surfaces of the gate spacer 60 vertically abut the top surfaces of the first doped semiconductor region 32. Embodiments in which the gate spacer 60 comprises a plurality of dielectric spacers are explicitly contemplated herein.

The gate spacer 60 comprises a dielectric material such as a dielectric oxide, a dielectric nitride, a dielectric oxynitride, or a combination thereof. For example, the gate spacer 60 may comprise silicon oxide, silicon nitride, silicon oxynitride, or a combination thereof. The lateral thickness of the gate spacer 60, as measured at the base of the gate spacer 60 that abut the first doped semiconductor region 32, may be from about 10 nm to about 150 nm, and typically from about 30 nm to about 100 nm, although lesser and greater lateral thicknesses are also contemplated herein.

Figure 3:
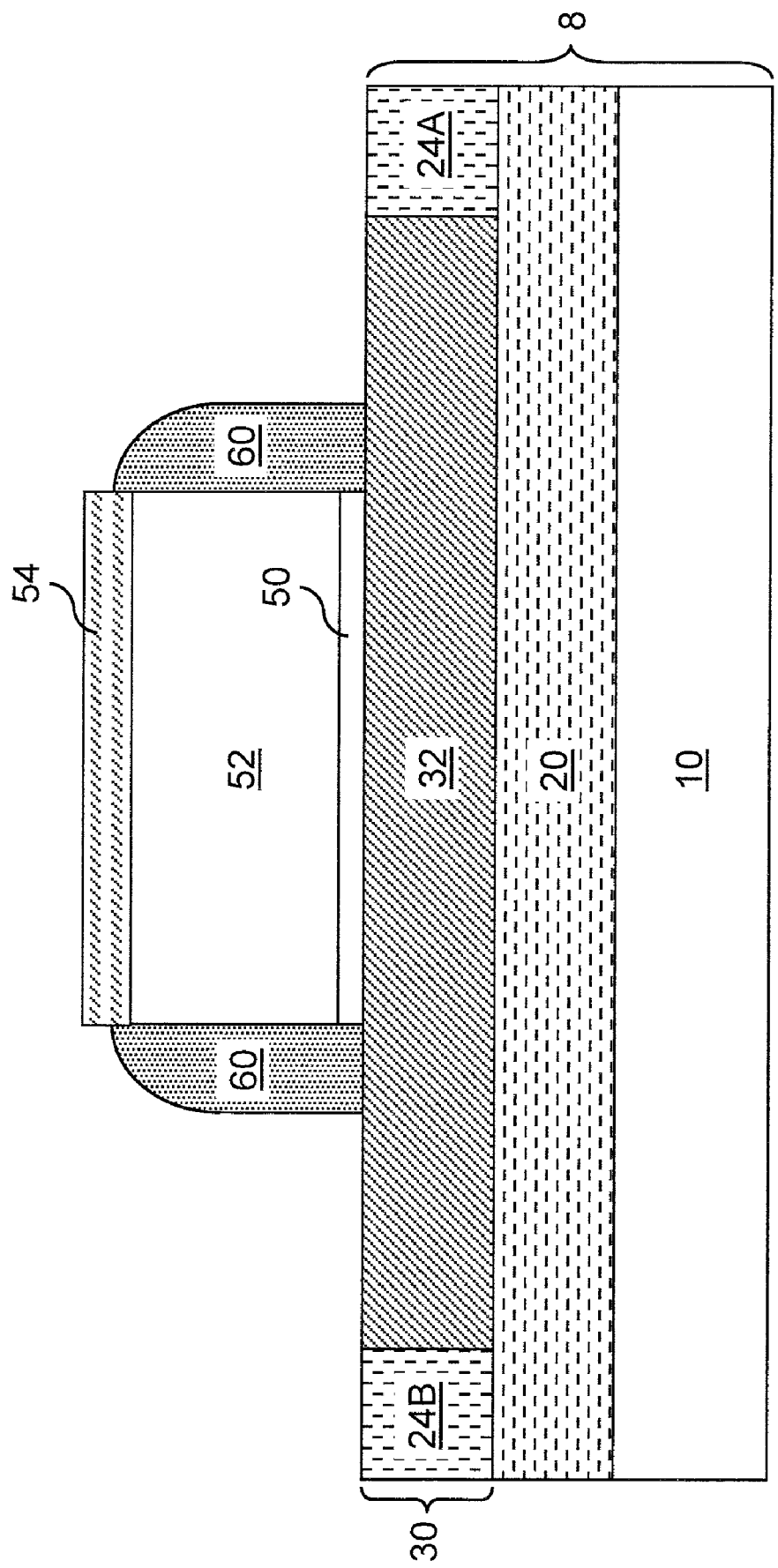
Figure 4:
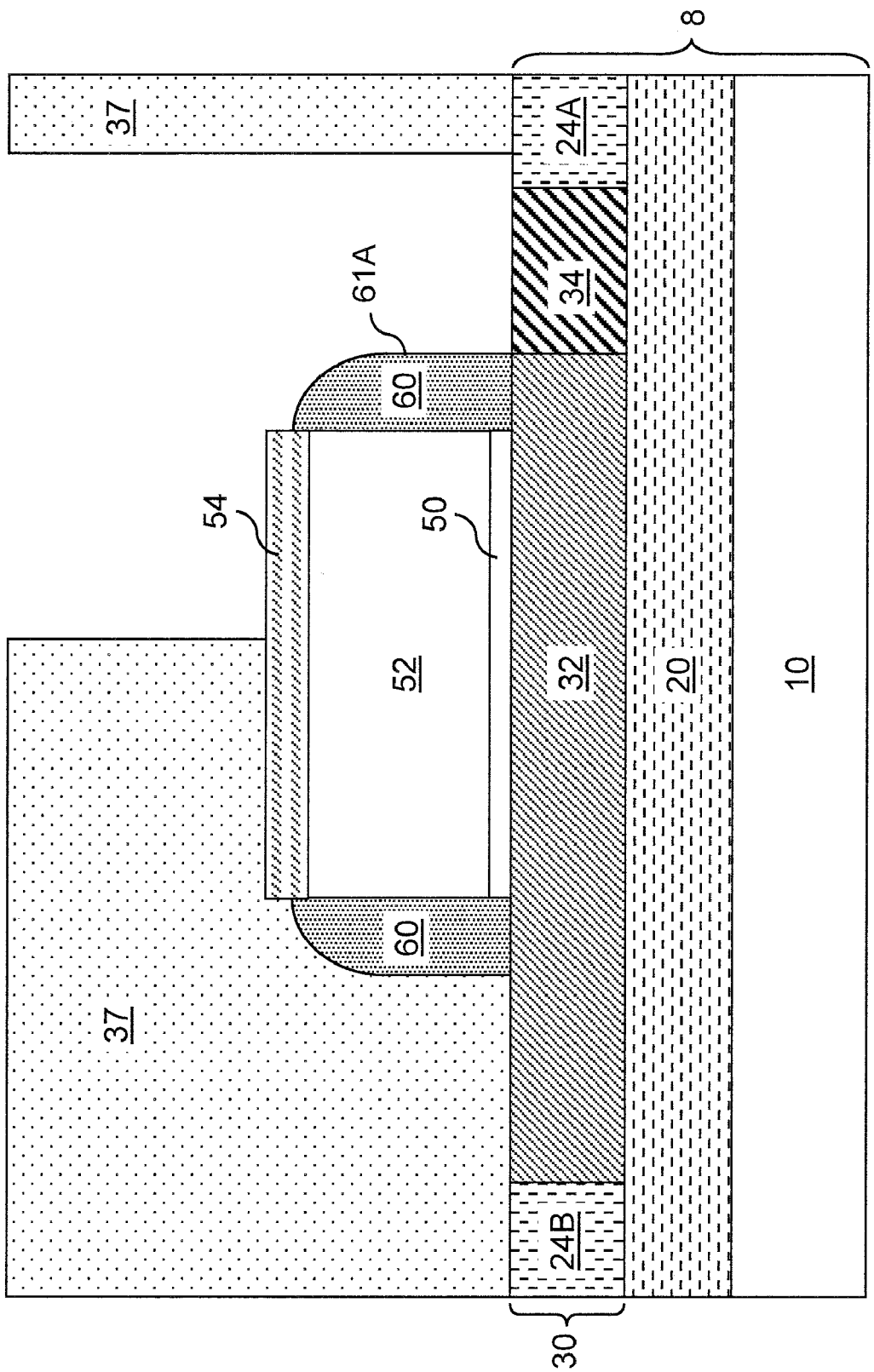

Referring to FIG. 4, a second photoresist 37 is applied over the top surfaces of the exemplary semiconductor structure including the top surfaces of the gate stack (50, 52, 54), the gate spacer 60, the first doped semiconductor region 32, and the first and second shallow trench isolation structures (24A, 24B). The second photoresist 37 is lithographically patterned to form an opening on one side of the gate stack (50, 52, 54). The opening in the second photoresist 37 laterally extends at least from an edge of the first shallow trench isolation structure 24A laterally abutting the first doped semiconductor region 32 (See FIG. 3) to the outer sidewall of the gate spacer 60 that is closest to the first shallow trench isolation structure 24A. This outer sidewall of the gate spacer 60 is herein referred to as a first gate spacer outer sidewall 61A. One edge of the second photoresist 37 may overlie the first shallow trench isolation structure 24A, and another edge of the second photoresist 37 may overlie the gate stack (50, 52, 54) or the gate spacer 60. The portion of the first doped semiconductor region 32 located on the other side of the first shallow trench isolation structure 24A remains covered with the second photoresist 37.

Dopants of the first conductivity type are implanted into the opening to form a first electrode 34 having a doping of the first conductivity type at a dopant concentration that is higher than the first dopant concentration. The portion of the first doped semiconductor region 32 that is implanted with the dopants of the first conductivity type during the masked ion implantation, in which the second photoresist 37, the gate electrode (50, 52, 54), and the gate spacer 60 collectively function as an implantation mask, becomes the first electrode. Since additional dopants of the first conductivity type are introduced into the first electrode 34, the dopant concentration of the first electrode 34 is higher than the dopant concentration of the first doped semiconductor portion 32, which has the first dopant concentration. Dopant concentration of the first electrode 34 may be from about $5.0 \times 10^{19}/cm^3$ to about $1.0 \times 10^{21}/cm^3$, and typically from about $1.0 \times 10^{20}/cm^3$ to about $5.0 \times 10^{20}/cm^3$, although lesser and greater dopant concentrations are also contemplated herein. The first electrode 34 provides a low resistance electrical contact to the first doped semiconductor region 32.

Preferably, the vertical thickness of the gate stack (50, 52, 54) is greater than the thickness of the first doped semiconductor region 32, which is the same as the thickness of the top semiconductor layer 30 to provide effective prevent implantation of the dopants of the first conductivity type underneath the gate stack (50, 52, 54) and the gate spacer 60. In case the implantation angle is zero, i.e., the dopants of the first conductivity type impinge on the exemplary semiconductor structure at a direction that is normal to the top surface of the top semiconductor layer 30, an edge of the first electrode is self-aligned to the first gate spacer outer sidewall 61A. In this case, the interface between the first electrode 34 and the first doped semiconductor region 32 is substantially vertically coincident with the first gate spacer outer sidewall 61A. The entirety of the interface between the first electrode 34 and the first doped semiconductor region 32 is substantially vertical from the top surface of the top semiconductor layer 30 to the top surface of the buried insulator layer 20. The second photoresist 37 is subsequently removed.

Embodiments in which angled ion implantation is employed so that the interface between the first electrode 34 and the first doped semiconductor region 32 underlies a portion of the gate spacer 60 are explicitly contemplated herein. In this case, the entirety of the interface between the first electrode 34 and the first doped semiconductor region 32 is substantially vertical from the top surface of the top semiconductor layer 30 to the top surface of the buried insulator layer 20. Embodiments in which angled ion implantation is employed with a tilt angle in the opposite direction so that the interface between the first electrode 34 and the first doped semiconductor region 32 does not underlie the gate spacer 60 are also explicitly contemplated herein. In this case, the interface between the first electrode 34 and the first doped semiconductor region 32 is deviates from a vertical plane.

Referring to FIG. 5, a third photoresist 47 is applied over the top surfaces of the exemplary semiconductor structure including the top surfaces of the gate stack (50, 52, 54), the gate spacer 60, the first doped semiconductor region 32, the first electrode 34, and the first and second shallow trench isolation structures (24A, 24B). The third photoresist 47 is lithographically patterned to form an opening on the other side of the gate stack (50, 52, 54), i.e., the opposite side of the opening in the second photoresist 37 (See FIG. 4), or the side now containing the first electrode 34. The opening in the third photoresist 47 laterally extends at least from an edge of the second shallow trench isolation structure 24B laterally abutting the first doped semiconductor region 32 (See FIG. 4) to an outer sidewall of the gate spacer 60 that is closest to the second shallow trench isolation structure 24B. This outer sidewall of the gate spacer 60 is herein referred to as a second gate spacer outer sidewall 61B. One edge of the third photoresist 47 may overlie the second shallow trench isolation structure 24B, and another edge of the third photoresist 47 may overlie the gate stack (50, 52, 54) or the gate spacer 60. The first electrode 34 is covered with the third photoresist 47.

The exposed portion of the first doped semiconductor region 32 is removed by an anisotropic etch that selectively etches the single-crystalline semiconductor material of the first doped semiconductor region 32, while not substantially etching the dielectric gate cap 54, the gate spacer 60, and the second shallow trench isolation structure 24B. The third photoresist 47, the gate electrode (50, 52, 54), the gate spacer 60, and the second shallow trench isolation structure 24B collectively function as an etch mask. The anisotropic etch does not induce any significant lateral undercut underneath the gate spacer 60. Thus, a substantially vertical sidewall 31 is formed on the outer surface of the remaining portion of the first doped semiconductor region 32. Preferably, the anisotropic etch proceeds until the top surface of the buried insulator layer 20 is exposed. The substantially vertical sidewall 31 extends from the top surface of the top semiconductor layer 30 to the top surface of the buried insulator layer 20, i.e., spans the entire thickness of the top semiconductor layer 30. A trench 49 laterally bounded by a sidewall of the second shallow trench isolation structure 24B and the substantially vertical sidewall 31 is formed directly on the exposed top surface of the buried insulator layer 20 at the top semiconductor layer level, i.e., within the top semiconductor layer 30.

The substantially vertical sidewall 31 is self-aligned to the second gate spacer outer sidewall 61B, i.e., the substantially vertical sidewall 31 and the second gate spacer outer sidewall 61B are substantially vertically coincident. In other words, the substantially vertical sidewall 31 and the second gate spacer outer sidewall 61B overlap in a top-down view. The third photoresist 47 is subsequently removed.

Embodiments in which the substantially vertical sidewall 31 is subsequently laterally recessed to underlie the gate spacer 60 are explicitly contemplated herein. In this case, the substantially vertical sidewall 31 underlies the gate spacer 60, and is substantially vertical even after such a lateral recess.

Figure 6:
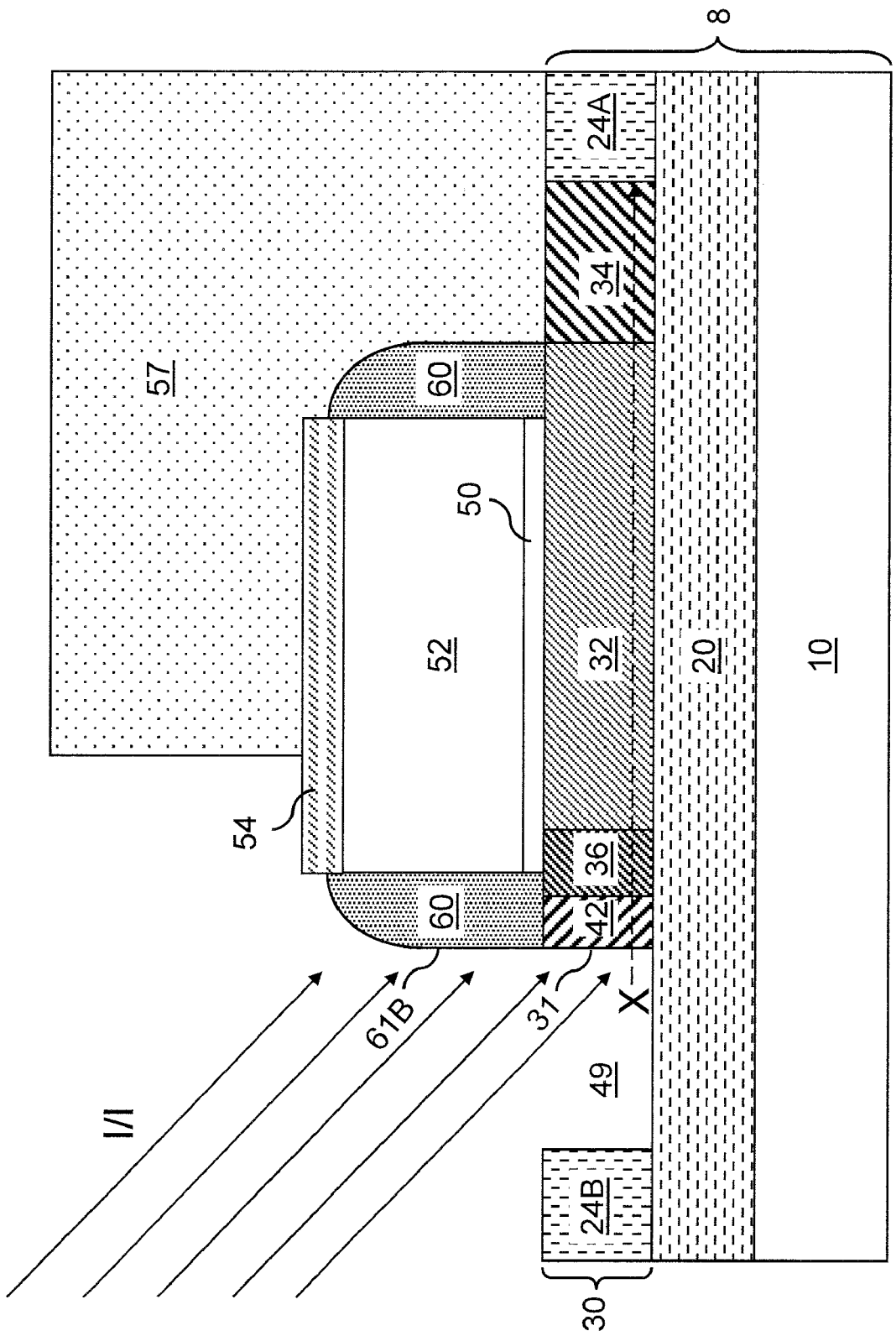

Referring to FIG. 6, a fourth photoresist 57 is applied over the top surfaces of the exemplary semiconductor structure including the top surfaces of the gate stack (50, 52, 54), the gate spacer 60, the first electrode 34, and the first and second shallow trench isolation structures (24A, 24B). The fourth photoresist 57 is lithographically patterned to form an opening overlying the trench 49. The substantially vertical sidewall 31 and the second gate spacer outer sidewall 61B are exposed. An edge of the fourth photoresist 57 may overlie the gate stack (50, 52, 54) or the gate spacer 60. The first electrode 34 is covered with the fourth photoresist 57.

Angled ion implantation is performed in two steps, of which the order may be exchanged. The two steps of the angled ion implantation are herein referred to as a first angled ion implantation and a second angled ion implantation.

In a first angled ion implantation, dopants of the first conductivity type are implanted through the substantially vertical sidewall 31 to a first mean implantation depth. The first mean implantation depth is the mean implantation depth of the dopant of the first conductivity type during the first angled ion implantation. A mean ion implantation depth herein denotes a mean distance between an entry point at the surface and the final location of the implanted ions as stopped in the implanted region. The mean ion implantation depth is therefore a mean distance that the ions travel in the direction of the impinging ion beam after entry into the implanted region. The first mean implantation depth may be modulated by the energy and the species of the ion beam of the first angled ion implantation. A second doped semiconductor region 36 having a doping of the first conductivity type and a higher dopant concentration range than the first dopant concentration is formed from an implanted portion of the first doped semiconductor region 32. The second doped semiconductor region 36 laterally abuts the first doped semiconductor region 32. The first doped semiconductor region 32 and the second doped semiconductor region 36 are herein collectively referred to as a doped semiconductor region (32, 36). The entirety of the doped semiconductor region (32, 36) has a doping of the first conductivity type.

The first doped semiconductor region 32 is located outside the range of implanted dopants of the first conductivity type during the implantation of the dopants of the first conductivity type through the substantially vertical sidewall 31, i.e., during the first angled ion implantation. The second doped semiconductor region 36 is located within the range of the implanted dopants during the first angled ion implantation. Thus, no dopants are added to the first doped semiconductor region 32, while the implanted dopants of the first conductivity type are added to the second doped semiconductor region 36.

In a second angled ion implantation, dopants of the second conductivity type are implanted through the substantially vertical sidewall 31 to a second mean implantation depth. The second mean implantation depth is the mean implantation depth of the dopant of the second conductivity type during the second angled ion implantation. The second mean implantation depth may be modulated by the energy and the species of the ion beam of the second angled ion implantation. A second electrode 42 is formed from a portion of the doped semiconductor region (32, 36).

A p-n junction is formed at the interface between the second electrode 42 and the second doped semiconductor region 36. The substantially vertical sidewall 31 and the second gate spacer outer sidewall 61B are substantially vertical, i.e., any angular deviation of the surfaces of substantially vertical sidewall 31 and the second gate spacer outer sidewall 61B from a surface normal of the top surface of the top semiconductor layer 30 is typically less than 4 degrees, and more typically less than 2 degrees. Thus, the p-n junction between the second electrode 42 and the second doped semiconductor region 36 is substantially vertical from the top surface of the top semiconductor layer 30 to the top surface of the buried insulator layer. Likewise, the interface between the second doped semiconductor region 36 and the first doped semiconductor region 32 is substantially vertical from the top surface of the top semiconductor layer 30 to the top surface of the buried insulator layer.

The first mean implantation depth is greater than the second mean implantation depth. In other words, the mean implantation depth of the dopants of the first conductivity type during the first angled ion implantation is greater than the mean implantation depth of the dopants of the second conductivity type during the second angled ion implantation.

The tilt angle of the first ion implantation and the tilt angle of the second ion implantation may be the same, or different. A tilt angle is the angle between an ion beam and a downward surface normal of the top surface of the top semiconductor layer 30. Typical tilt angles for the first and second ion implantations may be from about 5 degrees to about 60 degrees, and typically from about 20 degrees to about 50 degrees, although lesser and greater tilt angles are contemplated herein.

If the first angled ion implantation precedes the second angled ion implantation, the second electrode 42 may be formed by converting a portion of the second doped ion implantation region 36 into a region having a doping of the second conductivity type. If the second angled ion implantation precedes the first angled ion implantation, the second electrode 42 may be formed by converting a portion of the first doped ion implantation region 32 that abuts the substantially vertical sidewall 31. In this case, the second doped semiconductor portion 36 is subsequently formed by converting a remaining portion of the first doped semiconductor portion 32. As discussed above, the order of the first and second ion implantations may be reversed without affecting the resulting structure.

In an alternate embodiment, the third photoresist 47 may be used as the fourth photoresist 57 as well provided that the edge of the third photoresist 47 overlying the second shallow trench isolation structure 24B is located at a sufficient distance away from the trench 49 so that dopant ions may be implanted through the bottom portion of the substantially vertical sidewall 31 without being blocked by the third photoresist 47 during the angled ion implantation.

After the first and second angled ion implantations, the fourth photoresist 57 (or the third photoresist 47 if the third photoresist 47 is used as the masking layer for the ion implantation) is removed. The dielectric gate cap 54 is removed also. Preferably, the removal of the dielectric gate cap 54 is selective to the gate electrode 52, the first electrode 34, and the second electrode 42.

Figure 7:
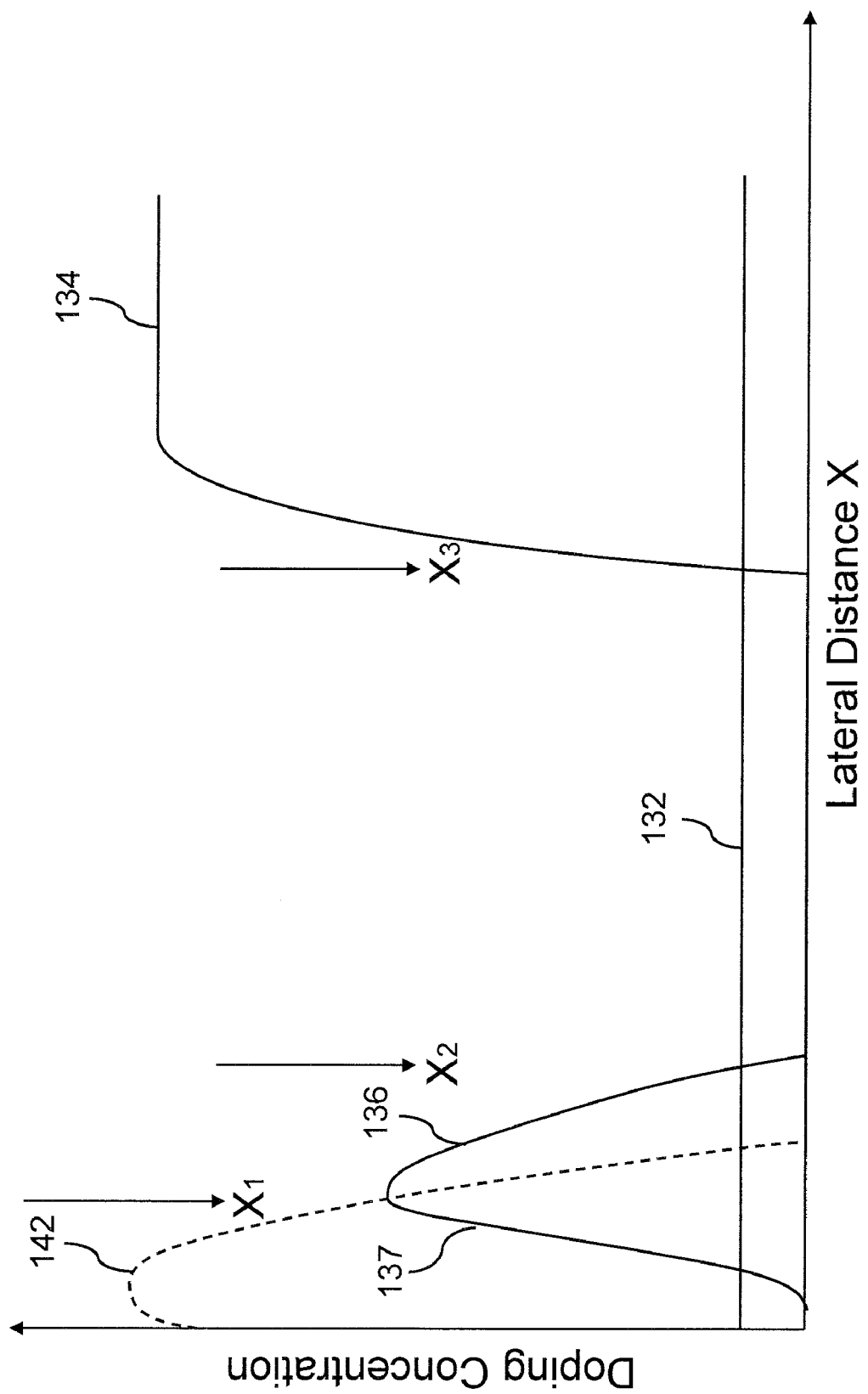
FIG. 7 shows various dopant concentration profiles along a direction of the arrow X in FIG. 6 through the second electrode 42, the second doped semiconductor region 36, the first doped semiconductor region 34, and the first electrode 34.

Referring to FIG. 7, dopant profiles along a horizontal direction in the direction of a dotted arrow marked with "X" through the second electrode 42, the second doped semiconductor region 36, the first doped semiconductor region 32, and the first electrode 34 are shown in the graph in FIG. 7. The horizontal axis of the graph represents a lateral distance from the substantially vertical sidewall 31 toward the first shallow trench isolation structure 24B. The vertical axis of the graph represents a dopant concentration within the various semiconductor regions (42, 36, 32, 34) in the top semiconductor layer 30.

The location of the p-n junction between the second electrode 42 and the second doped semiconductor region 36 is marked by a first lateral coordinate, $X_1$. The location of the interface between the second doped semiconductor region 36 and the first doped semiconductor region 32 is marked by a second lateral coordinate, $X_2$. The location of the interface between the first doped semiconductor region 32 and the first electrode 34 is marked by a third lateral coordinate, $X_3$.

The dopant profile of the dopants of the first conductivity type introduced by the ion implantation at a step corresponding to FIG. 1 employing the first photoresist as an implantation mask is represented by a first dopant concentration profile 132. The dopant profile of the dopants of the first conductivity type introduced by the ion implantation at a step corresponding to FIG. 4 employing the second photoresist 37 as an implantation mask is represented by a first-electrode-side dopant concentration profile 134. The dopant profile of the dopants of the first conductivity type within the second doped semiconductor region 36, which are introduced by the first angled ion implantation at one of the steps corresponding to FIG. 6 employing the fourth photoresist 57 (or the third photoresist 47), is represented by a second dopant concentration profile 136. The dopant profile of the dopants of the first conductivity type within the second electrode 42, which are introduced by the first angled ion implantation to forms the second dopant concentration profile, is represented by a third dopant concentration profile 137. The second dopant concentration profile 136 and the third dopant concentration profile 137 are formed simultaneously and refer to dopant concentration profile in the second doped semiconductor region 36 and the second electrode 42, respectively. The dopant profile of the dopants of the second conductivity type within the second electrode 42, which are introduced by the second angled ion implantation at another of the steps corresponding to FIG. 6, is represented by a fourth dopant concentration profile 142.

An extension of the fourth dopant concentration profile 142 in the second doped semiconductor region 36 is shown in a dotted curve. An extension of the first-electrode-side dopant concentration profile 134 in the first doped semiconductor region 32 is shown in a solid line.

The doped semiconductor region (32, 36) includes a first doped semiconductor region 32 having dopants of the first conductivity type and the first dopant concentration profile 132 and the second doped semiconductor region 36 having dopants of the first conductivity type and a second dopant concentration profile 136. The first dopant concentration profile 132 is substantially constant within the first doped semiconductor region 32. In one embodiment, the second dopant concentration profile 136 monotonically decreases within the second doped semiconductor region 36 from the p-n junction with the second electrode 42, which is represented by the first lateral coordinate, $X_1$, to an interface with the first doped semiconductor region 32, which is represented by the second lateral coordinate, $X_2$, with a lateral distance X from the p-n junction. Such a second dopant concentration profile is typical of a hyperabrupt junction.

The second electrode 42 includes dopants of the first conductivity type having the third dopant concentration profile 137 and dopants of the second conductivity type having a fourth dopant concentration profile 142. The value of the fourth dopant concentration profile 142 is greater than the value of the third concentration profile 137 throughout the second electrode 142, thereby rendering the doping type of the second electrode 42 the second conductivity type. At the p-n junction, the fourth dopant concentration profile has a sharp slope, while the second and third dopant concentration profiles (136, 137) approach their maximum or are gradually varying, thereby inducing formation of a hyperabrupt junction.

The term "hyperabrupt junction" is used to denote a type of p-n junction in which a dopant concentration profile changes in a controlled non-linear way with density of the dopants increasing towards the junction and abruptly dropping to zero at the p-n junction. Varactors that include an ion-implanted vertical hyperabrupt p-n junction are known in the art as "hyperabrupt junction varactors". See, for example, U.S. Pat. Nos. 4,226,648 to Goodwin, et al., 4,827,319 to Pavlidis, et al, 5,557,140 to Nguyen, et al. and 6,521,506 to Coolbaugh, et al. The methods of forming semiconductor structures including a vertical hyperabrupt junction are described in commonly-assigned, copending U.S. patent application Ser. Nos. 10/905, 486 (Pub. No. US2006/0145300A1) and 11/004,877 (Pub. No. US2005/0161770A1), the contents of which are incorporated herein by reference. Note that the prior arts disclose vertical hyperabrupt p-n junction which has a horizontal p-n junction surface formed by two vertically abutting regions having two different conductivity types. In contrast, the present invention forms lateral hyperabrupt p-n junction which has a vertical p-n junction surface formed by two laterally abutting regions, i.e., the second electrode 42 and the second doped semiconductor portion 36. Further, the present invention employs substantially vertical surfaces of the second gate spacer outer sidewall 61B and the substantially vertical sidewall 31 and angled ion implantations to form the lateral hyperabrupt p-n junction.

Preferably, the entire range of said fourth dopant concentration profile 142 is greater than an entire range of said first dopant concentration profile 132. The range for the third dopant concentration profile 136 may be from about $1.0 \times 10^{16}/cm^3$ to about $1.0 \times 10^{19}/cm^3$, and typically from about $3.0 \times 10^{16}/cm^3$ to about $3.0 \times 10^{18}/cm^3$, although lesser and greater ranges are also contemplated herein. The range for the fourth dopant concentration profile 142 may be from about $3.0 \times 10^{17}/cm^3$ to about $1.0 \times 10^{21}/cm^3$, and typically from about $1.0 \times 10^{18}/cm^3$ to about $5.0 \times 10^{20}/cm^3$, although lesser and greater ranges are also contemplated herein.

Figure 8:
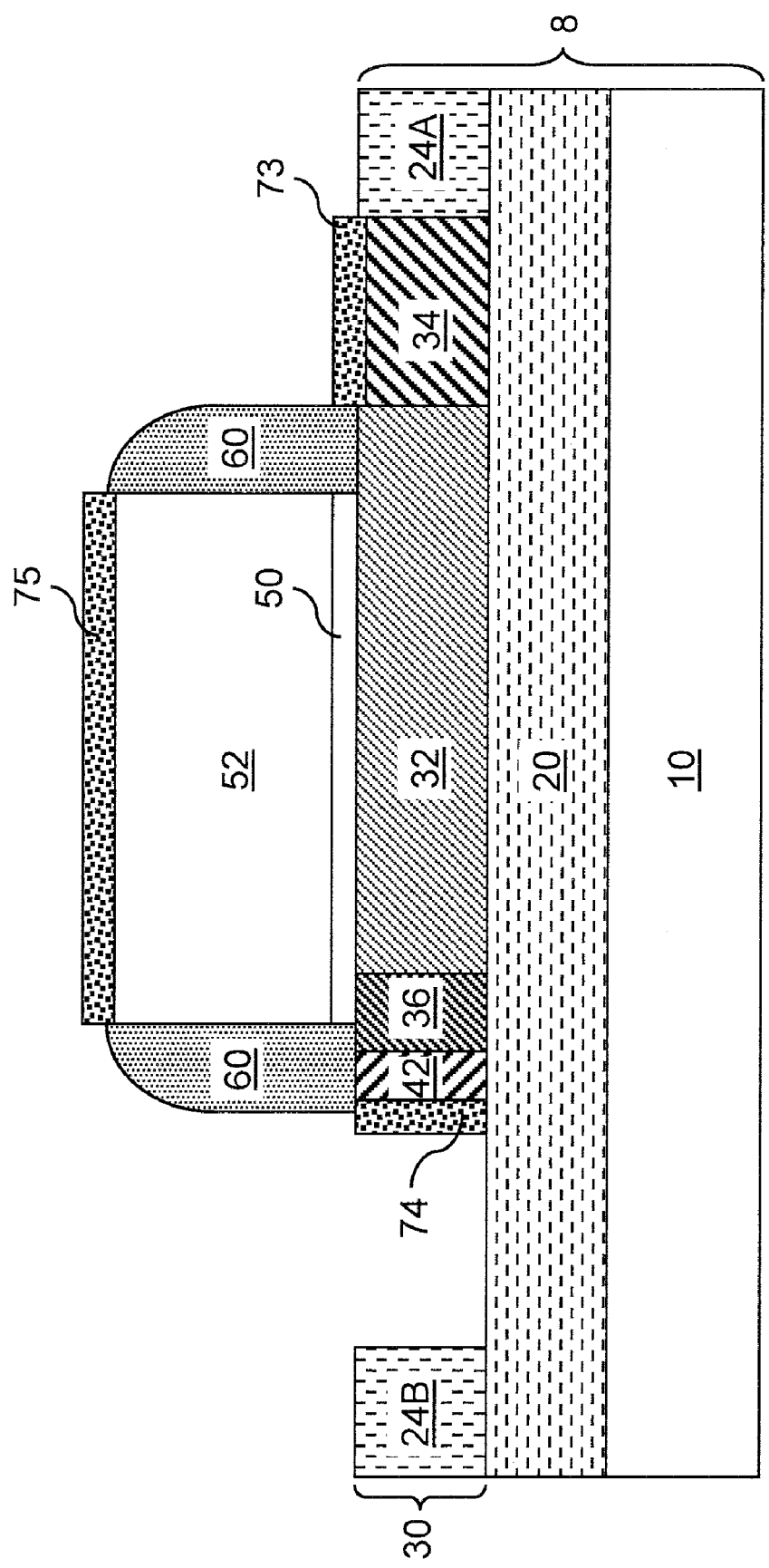

Referring to FIG. 8, various metal semiconductor alloy portions such as metal silicides may be formed on exposed semiconductor surfaces by depositing a metal layer (not shown) over the exemplary semiconductor structure and inducing formation of such metal semiconductor alloy portions by an anneal through reaction of the metal layer with underlying semiconductor materials. The unreacted portions of the metal layer are subsequently removed selective to the metal semiconductor alloy portions and dielectric materials.

The various metal semiconductor alloy portions may include a first-electrode-side metal semiconductor alloy portion 73, a second-electrode-side metal semiconductor alloy portion 74, and a gate-side metal semiconductor alloy portion 75. The first-electrode-side metal semiconductor alloy portion 73 is formed by reacting a top portion of the first electrode 34 with the metal layer. The second-electrode-side metal semiconductor alloy portion 74 is formed by reacting an exposed portion of the second electrode 42 including the substantially vertical sidewall 31 that is substantially vertically coincident with the second gate spacer outer sidewall 61B (See FIG. 6) with the metal layer. Since the semiconductor material of the second electrode 42 is consumed during the formation of the second-electrode-side metal semiconductor alloy portion 74, the interface between the second-electrode-side metal semiconductor alloy portion 74 and the second electrode 42 underlies the gate electrode 60. The second-electrode-side metal semiconductor alloy portion 74 vertically abuts the top surface of the buried insulator layer 20. The gate-side metal semiconductor alloy portion 75 is formed by reacting a top portion of the first electrode 34 with the metal layer.

Figure 9:
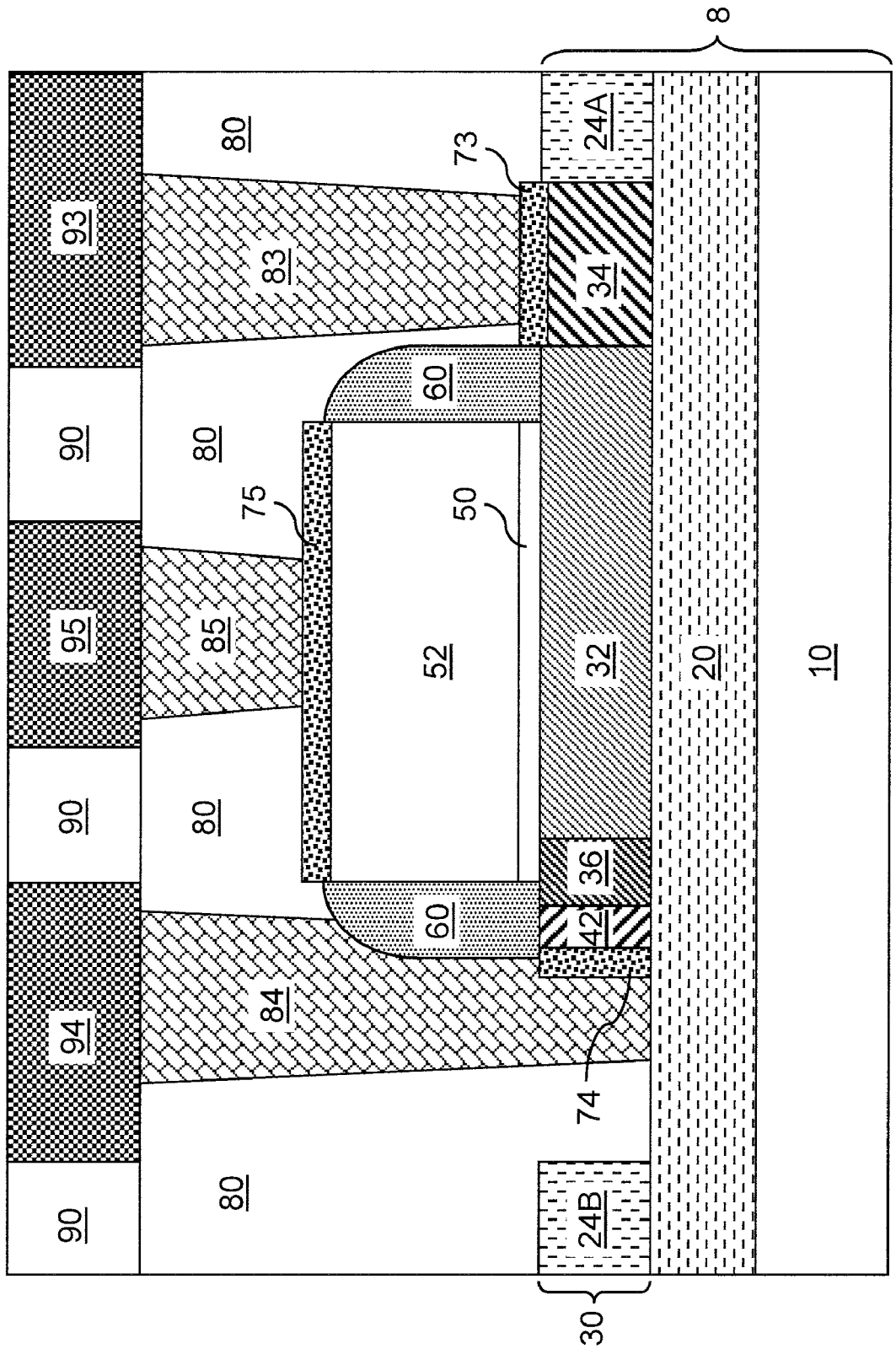

Referring to FIG. 9, a middle-of-line (MOL) dielectric layer 80 is formed directly on the exposed surfaces of the exemplary semiconductor structure including the exposed surfaces of the various metal semiconductor alloy portions (73, 74, 75), the top surfaces of first and second shallow trench isolation structure (24A, 24B), the sidewall surface of the second shallow trench isolation structure 24B, the outer surfaces of the gate spacer 60, and the exposed portion of the top surface of the buried insulator layer 20. The MOL dielectric layer 80 may comprise, for example, a CVD oxide. The CVD oxide may be an undoped silicate glass (USG), borosilicate glass (BSG), phosphosilicate glass (PSG), fluorosilicate glass (FSG), borophosphosilicate glass (BPSG), or a combination thereof. The thickness of the MOL dielectric layer 80 may be from about 200 nm to about 500 nm. Alternately, the MOL dielectric layer 80 may comprise an organosilicate glass (OSG) having a dielectric constant value of less than 2.8. The MOL dielectric layer 80 is preferably planarized, for example, by chemical mechanical polishing (CMP). Alternately, the MOL dielectric layer may be a self-planarizing material such as a spin-on glass (SOG) or a spin-on low-k dielectric material such as SiLK™.

Various contact via holes are formed in the MOL dielectric layer 80 and filled with metal to from various contact vias. The formation of the various contact via holes may be effected by applying a photoresist (not shown) over the MOL dielectric layer 80 and lithographically patterning the photoresist to form a pattern of via holes. The pattern of the via holes is transferred into the MOL dielectric layer 80 by an anisotropic etch, which is preferably selective to the various metal semiconductor alloy portions to accommodate the differences in the height of the via holes to be formed in the MOL dielectric layer 80. A conductive material such as doped polysilicon or a metal is deposited into the via holes, for example, by chemical vapor deposition (CVD). Excess conductive material over the top surface of the MOL dielectric layer 80 is removed by a recess etch, a planarization process, or a combination thereof to form the various contact vias.

Specifically, a second-electrode-side contact via 84 is formed directly on the second-electrode-side metal semiconductor alloy portion 74. The second-electrode-side contact via 84 laterally abuts the second-electrode-side metal semiconductor alloy portion 74 and vertically abuts a portion of the top surface of the buried insulator layer 20. Further, the second-electrode-side contact via 84 laterally abuts a sidewall of the gate spacer 60. In addition, the second-electrode-side contact via 84 abuts a top surface of a laterally protruding portion of the second-electrode-side metal semiconductor alloy portion 74 directly adjoined to an outer sidewall of the gate spacer 60. A portion of the MOL dielectric layer 80 contacts the top surface of the buried insulator layer 20.

A first-electrode-side contact via 83 is formed directly on the first-electrode-side metal semiconductor alloy portion 73. The first-electrode-side contact via 83 vertically abuts a top surface of the first-electrode-side metal semiconductor alloy portion 73. A gate-side contact via 85 is formed directly on the gate-side metal semiconductor alloy portion 75. The gate-side contact via 85 vertically abuts a top surface of the gate-side metal semiconductor alloy portion 75. The first-electrode-side contact via 83, the second-electrode-side contact via 84, and the gate-side contact via 85 are embedded in the MOL dielectric layer 80.

A line-level dielectric layer 90 is formed over the MOL dielectric layer 80. Various metal lines are formed to facilitate electrical connection to the first electrode 34, the second electrode 42, and the gate electrode 52. Specifically, a first-electrode-side metal line 93 is formed directly on the first-electrode-side contact via 83. A second-electrode-side metal line 94 is formed directly on the second-electrode-side contact via 84. A gate-side metal line 95 is formed directly on the gate-side contact via 85.

If the first conductivity type is p-type and the second conductivity type is n-type, the first electrode 34 is an anode of a varactor diode and the second electrode is a cathode of the varactor diode. If the first conductivity type is n-type and the second conductivity type is p-type, the first electrode 34 is a cathode of a varactor diode and the second electrode is an anode of the varactor diode. The gate electrode 52 provides modulation in depletion of the doped semiconductor region (32, 36). The hyperabrupt p-n junction at the boundary between the second electrode 42 and the second doped semiconductor region 36 enables a high tuning factor Q.

Since the hyperabrupt p-n junction of the present invention is lateral, i.e., the second electrode 42 and the second doped semiconductor region 36 laterally abut each other, the plane of the p-n junction is a substantially vertical plane. Thus, formation of the lateral p-n junction is possible irrespective of the thickness of the top semiconductor layer 30. In other words, the lateral hyperabrupt p-n junction may be formed in a top semiconductor layer 30 of any thickness. Thus, the varactor diode of the present invention having a lateral hyper abrupt p-n junction may be formed in a thin top semiconductor layer along with high performance semiconductor devices employing the thin top semiconductor layer.

Figure 10:
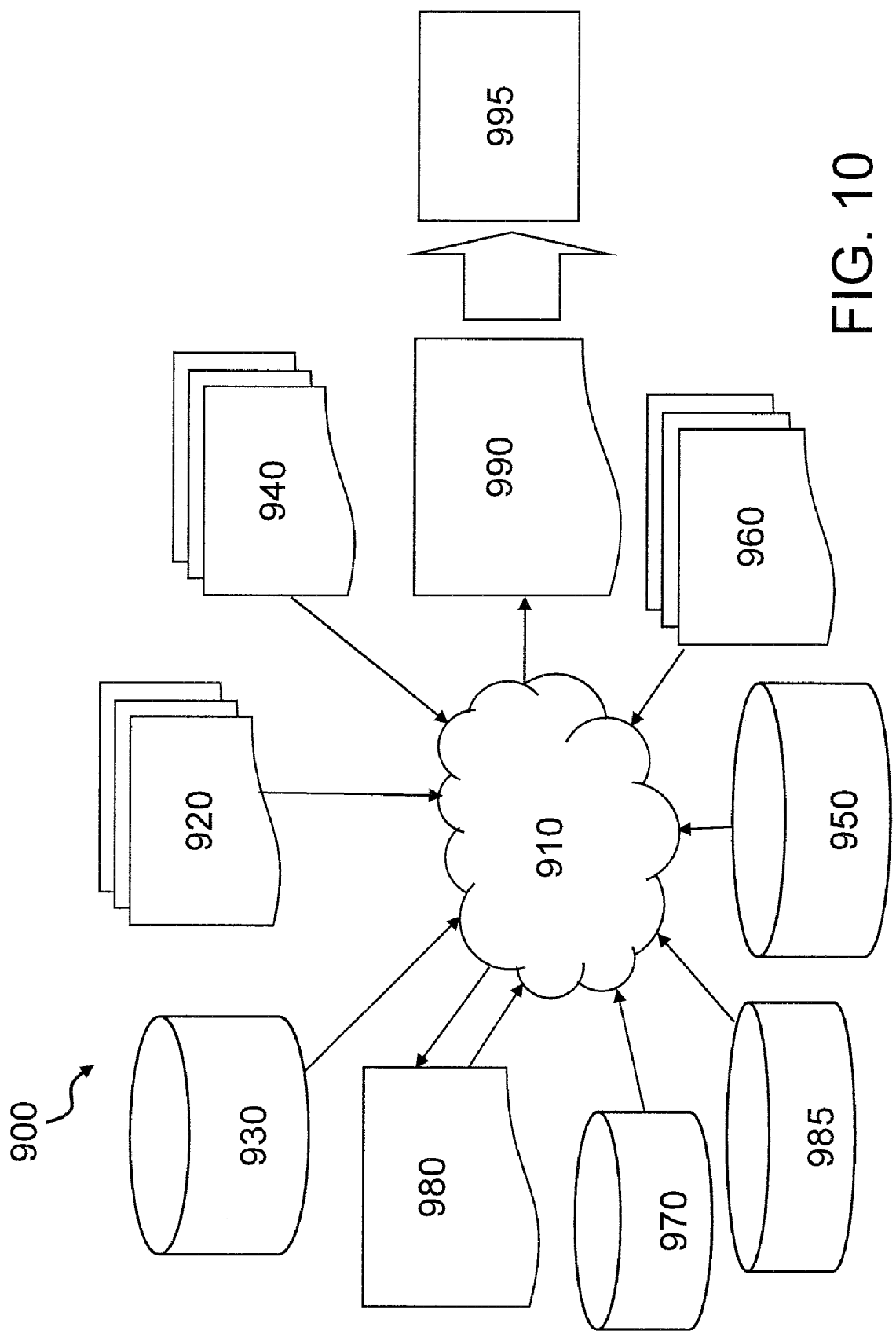
FIG. 10 is a flow diagram of a design process used in semiconductor design and manufacture of the semiconductor structures according to the present invention.

FIG. 10 shows a block diagram of an exemplary design flow 900 used for example, in semiconductor IC logic design, simulation, test, layout, and manufacture. Design flow 900 includes processes and mechanisms for processing design structures or devices to generate logically or otherwise functionally equivalent representations of the design structures and/or devices described above and shown in FIGS. 1-9. The design structures processes and/or generated by design flow 900 may be encoded on machine-readable transmission or storage media to include data and/or instructions that, when executed or otherwise processes on a data processing system, generate a logically, structurally, mechanically, or otherwise functionally equivalent representation of hardware components, circuits, devices, or systems. Design flow 900 may vary depending on the type of representation being designed. For example, a design flow for building an application specific integrated circuit (ASIC) may differ from a design flow 900 for designing a standard component or from a design flow 900 for instantiating the design into a programmable array, for example, a programmable gate array (PGA) or a field programmable gate array (FPGA) offered by Altera® Inc. or Xilinx® Inc.

FIG. 10 illustrates multiple such design structures including an input design structure 920 that is preferably processed by design process 910. Design structure 920 may be a logical simulation design structure generated and processed by design process 910 to produce a logically equivalent functional representation of a hardware device. Design structure 920 may also, or alternately, comprise data and/or program instructions that, when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-9. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-9 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a nonvolatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-9. In one embodiment, design structure 990 may comprise a compiled, executable HDL simulation model that functionally simulates the devices shown in FIGS. 1-9.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-9. Design structure 990 may then proceed to a stage 995 where, for example, design structure 990: proceeds to tape-out, is released to manufacturing, is released to a mask house, is sent to another design house, is sent back to the customer, etc.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A method of forming a semiconductor structure comprising:
   forming a gate stack on a doped semiconductor region having a doping of a first conductivity type in a top semiconductor layer of a semiconductor-on-insulator (SOI) substrate;
   forming a first electrode having a doping of said first conductivity type on one side of said gate stack;

removing a portion of said doped semiconductor region on one side of said gate stack, wherein a substantially vertical sidewall of said doped semiconductor region is exposed; and forming a second electrode having a doping of said second conductivity type directly on said substantially vertical sidewall in another portion of said doped semiconductor region, wherein said second conductivity type is the opposite of said first conductivity type, and wherein a p-n junction is formed between said second electrode and a remaining portion of said doped semiconductor region.

2. The method of claim 1, further comprising forming a gate spacer directly on said gate stack on said SOI substrate.

3. The method of claim 2, wherein said substantially vertical sidewall is self-aligned to an outer sidewall of said gate spacer.

4. The method of claim 1, further comprising forming a second-electrode-side metal semiconductor alloy portion directly on said substantially vertical sidewall and a buried insulator layer.

5. The method of claim 1, wherein said p-n junction is substantially vertical and directly adjoins a top surface of a buried insulator layer and a top surface of said top semiconductor layer.

6. The method of claim 1, wherein said second electrode is formed by implanting dopants of said second conductivity type through said substantially vertical sidewall by angled ion implantation.

7. The method of claim 1, wherein said first electrode, said second electrode, and said remaining portion of said doped semiconductor region are single crystalline and epitaxially aligned amongst one another.

8. The method of claim 1, further comprising forming a gate spacer directly on said gate stack, wherein said gate stack includes a gate dielectric vertically abutting said doped semiconductor region and a gate electrode, and wherein said p-n junction underlies said gate stack or said gate spacer.

9. The method of claim 1, further comprising:
forming a first-electrode-side metal semiconductor alloy portion directly on said first electrode;
forming a first-electrode-side contact via directly on said first-electrode-side metal semiconductor alloy portion;
forming a gate-side metal semiconductor alloy portion directly on said gate electrode;
forming a gate-side contact via directly on said gate-side metal semiconductor alloy portion; and
forming a middle-of-line (MOL) dielectric layer embedding said first-electrode-side contact via and said gate-side metal semiconductor alloy portion directly on a buried insulator layer.

* * * * *